(12) United States Patent
Han et al.

(10) Patent No.: US 10,203,790 B2
(45) Date of Patent: Feb. 12, 2019

(54) FOLDABLE DISPLAY DEVICE

(71) Applicant: LG DISPLAY CO., LTD., Seoul (KR)

(72) Inventors: Jong-Hyun Han, Paju-si (KR);
Gee-Sung Chae, Incheon (KR);
Young-Jin Choe, Goyang-si (KR);
Young-Gyu Moon, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 43 days.

(21) Appl. No.: 15/385,326

(22) Filed: Dec. 20, 2016

(65) Prior Publication Data

US 2017/0192572 A1    Jul. 6, 2017

(30) Foreign Application Priority Data

Dec. 31, 2015   (KR) .......................... 10-2015-0191502

(51) Int. Cl.
*G06F 3/041*    (2006.01)
*G06F 1/16*    (2006.01)
(Continued)

(52) U.S. Cl.
CPC .......... *G06F 3/0412* (2013.01); *G06F 1/1618* (2013.01); *G06F 1/1652* (2013.01);
(Continued)

(58) Field of Classification Search
CPC ...... G06F 3/0412; G06F 3/0416; G06F 3/044; G06F 1/1618; G06F 1/1652; G06F 2203/04102; G06F 2203/04103; G06F 2203/04106; H01L 27/323; H01L 2251/5338

See application file for complete search history.

(56) References Cited

U.S. PATENT DOCUMENTS 7,620,174 B1 * 11/2009 Bick ..................... G06F 1/1616
                                                                379/428.01
9,130,181 B2 * 9/2015 Choi ................... H01L 51/5284
(Continued)

FOREIGN PATENT DOCUMENTS

CN          103365594 A      10/2013
EP          2 704 196 A1      3/2014
(Continued)

OTHER PUBLICATIONS

Office Action of Japanese Patent Office in Appl'n No. 2016-251115, dated Oct. 3, 2017.
(Continued)

*Primary Examiner* — Peter D McLoone
(74) *Attorney, Agent, or Firm* — Dentons US LLP (57) ABSTRACT

Disclosed is a foldable display which includes a protective layer to protect a display area exposed when the display is folded and has a touch electrode array extension on the protective layer so as to enable touch input in the display area. The foldable display includes a display panel provided with a front surface, a part of which is exposed when the foldable display is folded, and including a touch electrode array, and a support part adhered to the rear surface of the display panel, and the touch electrode array includes the touch electrode array extension provided to cover a part of the front surface of the foldable display exposed when the foldable display is folded.

9 Claims, 6 Drawing Sheets

(51) Int. Cl.
*G06F 3/044* (2006.01)
*H01L 27/32* (2006.01)
*H01L 51/52* (2006.01)

(52) U.S. Cl.
CPC ............ *G06F 3/044* (2013.01); *G06F 3/0416* (2013.01); *H01L 27/323* (2013.01); *H01L 51/5281* (2013.01); *G06F 2203/04102* (2013.01); *G06F 2203/04103* (2013.01); *G06F 2203/04106* (2013.01); *H01L 2251/5338* (2013.01)

(56) References Cited

U.S. PATENT DOCUMENTS

| | | | | |
|---|---|---|---|---|
| 9,196,662 | B2* | 11/2015 | Choi | H01L 51/5284 |
| 9,342,106 | B2* | 5/2016 | Nurmi | G06F 1/1652 |
| 9,639,177 | B2* | 5/2017 | Kim | G06F 3/0346 |
| 9,686,837 | B1* | 6/2017 | Yang | G06F 1/1652 |
| 9,830,075 | B2* | 11/2017 | Kim | G06F 3/04817 |
| 2009/0137281 | A1* | 5/2009 | Ke | G06F 3/041 455/566 |
| 2012/0206386 | A1* | 8/2012 | Xu | G06F 1/1616 345/173 |
| 2014/0061597 | A1* | 3/2014 | Choi | H01L 51/5284 257/40 |
| 2014/0362513 | A1* | 12/2014 | Nurmi | G06F 1/1652 361/679.27 |
| 2015/0227271 | A1* | 8/2015 | Kang | G06F 3/0482 715/781 |
| 2015/0227286 | A1* | 8/2015 | Kang | H04M 1/0214 715/781 |
| 2015/0249114 | A1* | 9/2015 | Choi | H01L 51/5284 438/25 |
| 2015/0378557 | A1* | 12/2015 | Jeong | G06F 3/0488 715/835 |
| 2016/0026381 | A1* | 1/2016 | Kim | G06F 3/04817 715/761 |
| 2016/0070305 | A1* | 3/2016 | Kim | G06F 1/1652 345/173 |
| 2016/0085319 | A1* | 3/2016 | Kim | G06F 3/0346 345/156 |
| 2016/0132074 | A1* | 5/2016 | Kim | G06F 1/1652 715/769 |
| 2016/0291642 | A1* | 10/2016 | Kwak | G06F 1/1652 |
| 2016/0351127 | A1* | 12/2016 | Yoo | G09G 3/3208 |
| 2016/0364139 | A1* | 12/2016 | Kim | G06F 1/1626 |
| 2017/0069299 | A1* | 3/2017 | Kwak | G06F 3/147 |
| 2017/0171939 | A1* | 6/2017 | Yang | G06F 1/1652 |
| 2018/0039410 | A1* | 2/2018 | Kim | G06F 3/04817 |

FOREIGN PATENT DOCUMENTS

| | | |
|---|---|---|
| JP | 2010-066916 A | 3/2010 |
| JP | 2013-218696 A | 10/2013 |
| JP | 2014-049436 A | 3/2014 |
| JP | 2015-225331 A | 12/2015 |
| JP | 2015-228022 A | 12/2015 |
| TW | 201409679 A | 3/2014 |
| WO | 2015/199453 A1 | 12/2015 |

OTHER PUBLICATIONS

Office Action of Taiwanese Patent Office in Appl'n No. 105143204, dated Feb. 27, 2018.

* cited by examiner

FOLDABLE DISPLAY DEVICE

This application claims the benefit of Korean Patent Application No. 10-2015-0191502, filed on Dec. 31, 2015, which is hereby incorporated by reference as if fully set forth herein.

BACKGROUND OF THE INVENTION

Field of the Invention

The present invention relates to a display device and a method of manufacturing the same, and more particularly, to a foldable display including an array of touch electrodes.

Discussion of the Related Art

An image display, which displays various pieces of information on a screen, is a core technology in the information and communication age and is being developed to have slim profile, lightweight, and high portability and performance. As a flat panel display with reduced weight and volume addressing the drawbacks of a cathode ray tube (CRT), an organic light emitting display, which controls an amount of light emission from an organic light emitting layer to display an image, is recently in the spotlight.

In the organic light emitting display, a plurality of pixels are arranged in a matrix to display an image. Here, each pixel includes a light emitting device and a pixel driving circuit including a plurality of transistors independently driving the light emitting device. Such an organic light emitting display is a self-emitting type display and thus does not require a separate light source, and may be implemented as an ultra-thin display.

Also, researches on an in-cell touch type foldable display, which uses such organic light emitting devices and includes an array of touch electrodes within a light emitting cell, are being vigorously carried out these days.

A conventional foldable display is designed such that the center of the foldable display is folded or both ends of the foldable display are folded. In this case, a folded part of the foldable display may be designed to display an image, but when the foldable display is folded, an area displaying an image may additionally require a protective layer to protect the display surface of the foldable display. Such a protective layer is not provided with a touch input component in the conventional foldable display, and thus, touch input may not be possible when the foldable display is folded.

SUMMARY

Accordingly, the present invention is directed to a foldable display and a method of manufacturing the same that substantially obviate one or more problems due to limitations and disadvantages of the related art.

An advantage of the present invention is to provide a foldable display which includes a protective part to protect a display area exposed when the display is folded and has a touch electrode array extension on the protective part so as to enable touch input in the display area.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, a foldable display may, for example, include a display panel including an organic light emitting device array, a thin film transistor array configured to drive the organic light emitting device array, and a touch electrode array bonded to the organic light emitting device array through a first adhesive layer, the display panel having at least one folding area; and a support part adhered to a rear surface of the display panel through a second adhesive layer, wherein: the touch electrode array includes a touch electrode array extension extending further than one end of the organic light emitting device array and located facing an end of the organic light emitting device array when the display panel is folded; and the display panel displays an image in a display area corresponding to the touch electrode array extension when the display panel is folded.

In another aspect, a foldable display may include a display panel provided with a front surface, a part of which is exposed when the foldable display is folded, and including a touch electrode array, and a support part adhered to the rear surface of the display panel, wherein the touch electrode array includes a touch electrode array extension provided to cover a part of the front surface of the foldable display exposed when the foldable display is folded.

The touch electrode array extension may be adhered to an extension region of the support part, or be fixed by a separate frame.

The extension region of the support part may be formed of transparent glass or a transparent polymer and, thus, an image displayed on the front surface of the foldable display is displayed through the extension region of the support part when the foldable display is folded.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE ILLUSTRATED EMBODIMENTS

Reference will now be made in detail to the preferred embodiments of the present invention, examples of which are illustrated in the accompanying drawings. Wherever possible, the same reference numbers will be used throughout the drawings to refer to the same or like parts. In the following description, a detailed description of known functions and configurations incorporated herein will be omitted when it may make the subject matter of the present invention rather unclear. Further, names of elements, which will be used in the following description, are selected in consideration of ease in preparation of the specification and may thus differ from names of elements of an actual product.

Figure 1:
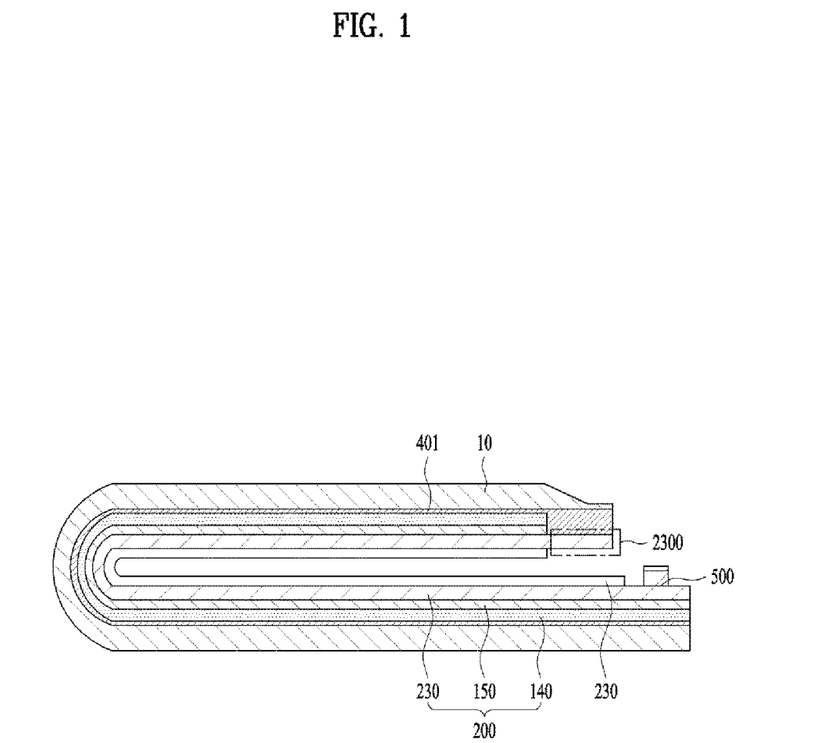
FIG. 1 is an exemplary view illustrating a foldable display in accordance with an embodiment of the present invention.

FIG. 1 is an exemplary view illustrating a foldable display in accordance with an embodiment of the present invention.

The foldable display in accordance with an embodiment of the present invention includes a display panel 200 including at least one folding area F/A within a display area, and a support part 10 located on a rear surface of the display panel 200 to support the display panel 200. A cover film (not shown) may be further located on a display surface of the foldable display.

Here, the display panel 200 is, for example, an in-cell type in which an array of touch electrodes 230 is implemented within the display panel 200.

Figure 3:
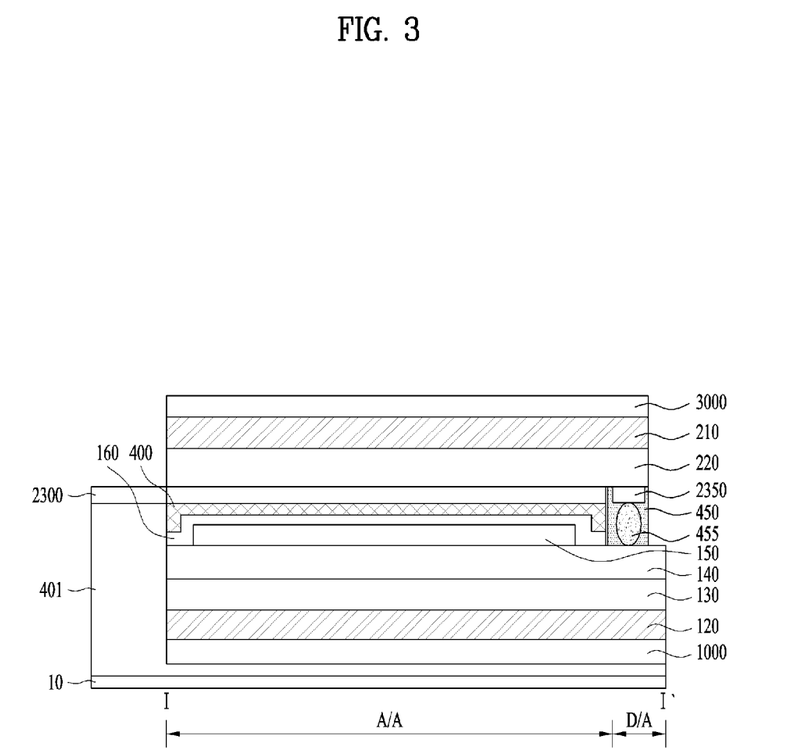
FIG. 3 is a cross-sectional view taken along line I-I' of FIG. 2.

The display panel 200 has a structure in which an array of organic light emitting devices 150 is located on an array of thin film transistors 140 and the array of organic light emitting devices 150 and the array of touch electrodes 230 are bonded by a first adhesive layer 400 (with reference to FIG. 3). Here, a protective layer 160 may be further located on the organic light emitting device array 150 and thus, the protective layer 160 and the touch electrode array 230 may be bonded by the first adhesive layer 400.

The display panel 200 is fixed to a support part 10 by a second adhesive layer 401. Here, one side of the touch electrode array 230 of the display panel 200 is provided with a touch electrode array extension 2300 extending from one side thereof, as compared with one side of each of the organic light emitting device array 150 and the thin film transistor array 140.

Here, the display panel 200 has at least one folding area. When the display panel 200 is folded, one end of the touch electrode array extension 2300 is located so as to be opposite the other side of the touch electrode array 230 at which the organic light emitting device array 150 and the thin film transistor array 140 are formed.

A polarizing plate 3000 may be further provided on the touch electrode array 230. Further, a cover glass may be further located on the polarizing plate 3000.

The foldable display in accordance with an embodiment of the present invention will be described in more detail with reference to FIGS. 2 and 3.

Figure 2:
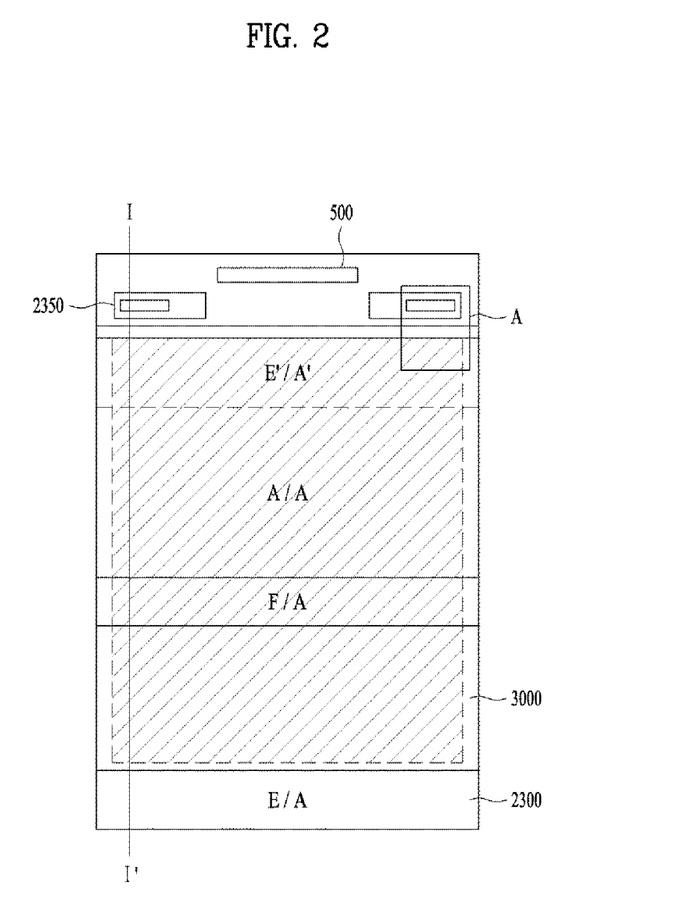
FIG. 2 is a plan view illustrating a foldable display in accordance with an embodiment of the present invention.

FIG. 2 is a plan view illustrating the foldable display in accordance with the present invention, and FIG. 3 is a cross-sectional view taken along line I-I' of FIG. 2.

As exemplarily shown in FIGS. 2 and 3, in the foldable display, the organic light emitting device array 150 and the touch electrode array 230 respectively formed on inner surfaces of a film substrate 1000 and the polarizing plate 3000 having different sizes are bonded by the first adhesive layer 400.

Here, the organic light emitting device array 150 and the touch electrode array 230 may be directly formed on the film substrate 1000 and the polarizing plate 3000. Alternatively, a lower substrate (not shown) and an upper substrate (not shown) formed of glass may be separately provided, the organic light emitting device array 150 and the touch electrode array 230 may be formed on these substrates so as to achieve thickness reduction and flexibility, and then, the upper and lower substrates may be removed by, for example, a laser irradiation or etching method. FIGS. 2 and 3 illustrate that the film substrate 1000 and the polarizing plate 3000 are bonded to the surfaces of the organic light emitting device array 150 and the touch electrode array 230 exposed to the outside by removing the upper and lower substrates formed of glass.

When the foldable display including the display panel 200 of FIG. 1 is folded, the touch electrode array extension E/A 2300 is located so as to cover a part E'/A' of a display area of the display panel 200. The second adhesive layer 401 and the support part 10 located on a rear surface of the touch electrode array extension 2300 are formed of transparent materials. The second adhesive layer 401 may be formed of a thermohardening or UV hardening resin or a double-sided tape, and a surface of the support part 10 corresponding to the touch electrode array extension 2300 may be formed of transparent plastic or glass. By doing so, even when the foldable display is folded, the support part 10 and the second adhesive layer 401 at the part E'/A' of the display area, covered by the touch electrode array extension 2300, can transmit light and thus display an image.

Here, touch electrodes are provided in the touch electrode array 230 and the touch electrode array extension 2300. The touch electrodes provided in the touch electrode array extension 2300 may be inactivated so as not to respond to external touches in the unfolded (spread) state of the foldable display. Thereafter, when the foldable display is in a folded state, the touch electrodes provided in the touch electrode array extension 2300 are activated so as to respond to external touches. Simultaneously, the touch electrodes located in the touch electrode array 230 except for the touch electrode array extension 2300 are inactivated so as not to respond to touches. Further, priority may be set so that a touch signal from the touch electrode array extension 2300 may be sensed with the highest priority. This will be described later.

When the touch electrodes provided in the touch electrode array extension 2300 are activated so as to respond to external touches, in a folded state of the foldable display, the part E'/A' of the display area responds according to the touch input of the touch electrode array extension 2300.

As exemplarily shown in FIG. 3, a first anti-etching film 120, a first buffer layer 130, the thin film transistor array 140 and the organic light emitting device array 150 are sequentially located on the film substrate 1000, and the protective layer 160 is located so as to cover the organic light emitting device array 150. A second anti-etching film 210, a second buffer layer 220 and the touch electrode array 230 are disposed on an inner surface of the polarizing plate 3000. Here, the touch electrode array 230 and the organic light emitting device array 150 are located so as to be opposite each other. The protective layer 160 directly contacts a lower surface of the first adhesive layer 400, and the touch electrode array 230 directly contacts an upper surface of the first adhesive layer 400.

The thin film transistor array 140, the organic light emitting device array 150 and the touch electrode array 230 constitute the display panel 200. The support part 10 is located on a rear surface of the film substrate 1000.

An active area and a dead area are defined on each of the first buffer layer 130 and the second buffer layer 220, and the touch electrode array 230, the light emitting device array 150 and the thin film transistors in the thin film transistor array 140 except for pad parts are formed in the active area. Further, touch electrode pad parts 2350 and the pad parts of the thin film transistor array 140 are defined in a part of the dead area.

Here, the first anti-etching film 120 and the second anti-etching film 210 are provided so as to reduce or prevent damage to the inner arrays except for the upper and lower substrates formed of glass during a laser irradiation or etching process. Additionally, the first anti-etching film 120 and the second anti-etching film 210 may serve as the film substrate 1000 and the cover glass to protect the display panel 200 from external environments.

The first and second anti-etching films 120 and 210 may be formed of polymer, such as polyimide or photo acryl.

Each of the first buffer layer 130 and the second buffer layer 220 is formed by continuously stacking the same type of an inorganic film, such as an oxide film ($SiO_2$) or a nitride film ($SiN_x$), or formed by alternately stacking different inorganic films. The first and second buffer layers 130 and 210 function as barriers to reduce or prevent moisture or outdoor air from permeating into the organic light emitting device array 150 during subsequent processes after bonding the upper substrate to the lower substrate.

Further, the touch electrode array 230 and the touch pad parts 2350 are formed on the same surface of the second buffer layer 220.

The touch pad parts 2350 are connected to the pad parts of the thin film transistor array 140 by a sealant 450 including conductive balls 455 during the process of bonding the upper and lower substrates using the first adhesive layer 400. The first adhesive layer 400 has a function of reducing or preventing moisture permeation and directly contacts the protective layer 160 covering the organic light emitting device array 150, thus more firmly reducing or preventing outdoor air or moisture from entering into the organic light emitting device array 150, along with the protective layer 160.

Here, the thin film transistor array 140 including the pad parts is configured such that one side of the thin film transistor 140 protrudes, as compared to the touch electrode array 230, and a driver IC 500, which transmits a signal to drive the touch electrode array 230, the thin film transistor array 140 and the organic light emitting device array 150, is provided at the protruding part of the thin film transistor array 140. Although not shown in the drawings, the driver IC 500, thin film transistor array drive pads and dummy pads include a plurality of dummy electrodes and are connected through wirings. The driver IC 500 is connected to a flexible printed circuit board (FPCB; not shown) by bonding, after removal of the substrates formed of glass, and may thus be controlled by a micro control unit (not shown) and a timing controller (not shown) provided on the FPCB. The dummy pads may be formed in the same layer as metal forming gate lines or data lines in regions of the dead area corresponding to the touch pad parts outside the active area.

The touch pad parts 2350 are formed on the second buffer layer 220 and, more particularly, are formed at both sides of the edge of a relatively protruding side of the lower substrate. One of the touch pad parts 2350 includes a plurality of touch pad electrodes to apply a voltage to first touch electrodes arranged in the X-axis direction of the touch electrode array 230 or to detect a voltage applied to the first touch electrodes, and the other includes a plurality of touch pad electrodes to apply a voltage to second touch electrodes arranged in the Y-axis direction of the touch electrode array 230 or to detect a voltage applied to the second touch electrodes.

The touch pad parts 2350 are connected to the pad parts of the thin film transistor array 140 by the sealant 450 including the conductive balls 455 during the bonding process of the upper and lower substrates using the first adhesive layer 400. The first adhesive layer 400 has a function of reducing or preventing moisture permeation and directly contacts the protective layer 160 covering the organic light emitting device array 150, thus more firmly reducing or preventing outdoor air or moisture from entering into the organic light emitting device array 150, along with the protective layer 160. Here, the thin film transistor array 140 including the pad parts is configured such that one side of the thin film transistor 140 protrudes to the outside, as compared to the touch electrode array 230, and a flexible printed circuit board 510, on which the driver IC 500 to drive the touch electrode array 230 and the thin film transistor array 140 is mounted, is bonded to the protruding part of the thin film transistor array 140. An anisotropic conductive film (ACF) may be formed at the protruding part.

The driver IC 500 may be mounted in a chip on film (COF) manner on the flexible printed circuit board (FPCB) 510 or the anisotropic conductive film (ACF).

Although not shown in the drawings, the thin film transistor array drive pads and the dummy pads are connected to the flexible printed circuit board (FPCB) 510 through wirings (not shown) formed on the lower substrate 1000. Further, a controller (not shown) for controlling the driver IC 500 may be further provided on the flexible printed circuit board (FPCB) 510.

The dummy pads are formed in the same layer as metal forming the gate lines or the data lines in regions of the dead area corresponding to the touch pad parts outside the active area.

The touch pad parts 2350 include a plurality of touch pad electrodes. Routing lines provided in the Y-axis direction and connecting the touch electrodes of the touch electrode array 230 and the touch pad parts 2350 are provided at both sides of the lower substrate 1000.

The support part 10 is adhered to a rear surface of the film substrate 1000 by the second adhesive layer 401. The support part 10 protects the foldable display from external impact, and includes at least one flexible part so that the foldable display may be folded.

The touch electrode array 230 includes the touch electrode array extension 2300 extending from one side thereof, as compared to the thin film transistor array 140 and the organic light emitting device array 150.

The support part 10 may be located on the overall rear surface of the touch electrode array 230 including the touch electrode array extension 2300 so as to support the touch electrode array extension 2300 and the touch electrode array 230. In this case, the second adhesive layer 401 located between the rear surface of the touch electrode array extension 2300 and the support part 10 has an increased thickness with a total thickness of the thin film transistor array 140 and the organic light emitting device array 150, thus fixing the touch electrode array extension 2300 to the support part 10.

Further, the touch electrode array extension 2300 may be supported by a separate outer frame (not shown) or a bezel (not shown).

Figure 4:
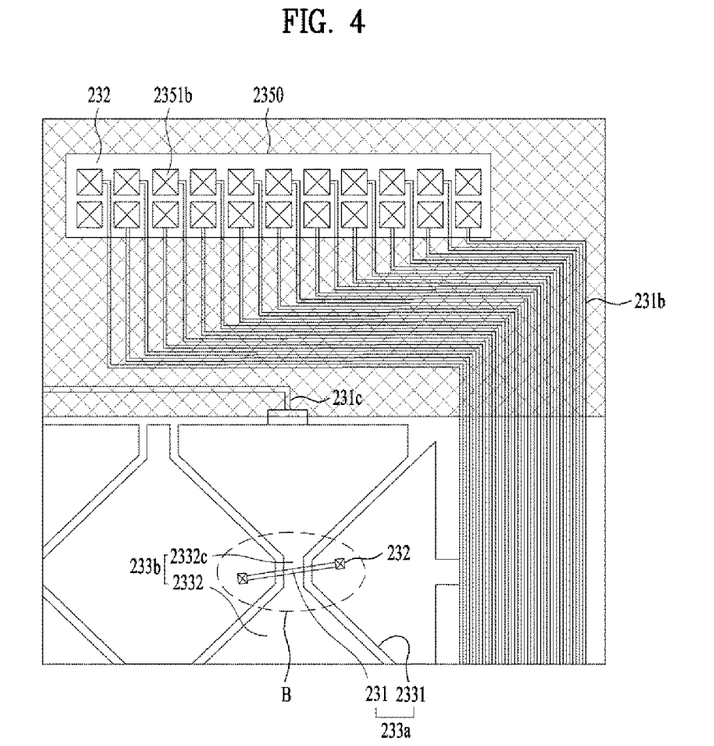
FIGS. 4 and 5 are cross-sectional views illustrating connection relations between a bridge and touch electrodes.
Figure 5:
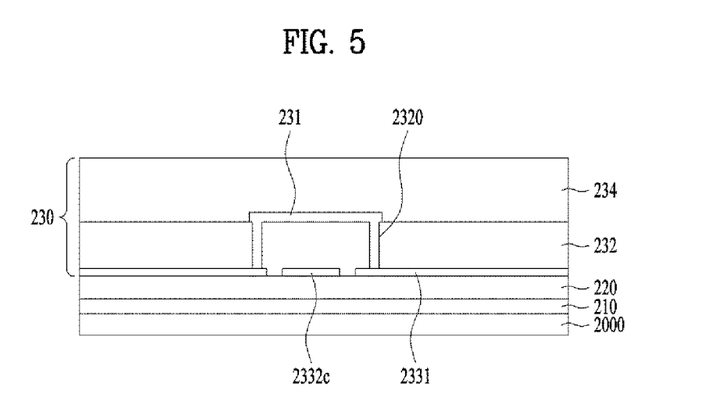

FIGS. 4 and 5 are schematic views illustrating connection relations between a bridge and touch electrodes.

As exemplarily shown in FIGS. 4 and 5, the touch electrode array 230 in accordance with one embodiment of the present invention includes first touch electrodes 233a and second touch electrodes 233b which cross each other, and touch pad electrodes 2351b (provided in the touch pad parts 2350) which respectively transmit a signal to the first and second touch electrodes 233a and 233b. The touch pad electrodes 2351b may be connected to the dummy pads (not shown) formed in the dead area of the thin film transistor array 140. Although FIG. 2 illustrates the thin film transistor array 140 as including the dummy pads, and one touch electrode layer as including the touch pads and the first and second touch electrodes 233*a* and 233*b*, these layers are divisionally patterned according to respective electrodes.

Here, the first touch electrodes 233*a* may include first electrode patterns 2331 having an island shape and spaced apart from each other in a first direction, and metal bridges 231 connecting one first electrode pattern 2331 and another first electrode pattern 2331 adjacent to another layer. The second touch electrodes 233*b* may include second electrode patterns 2332 disposed in a direction crossing the first direction and having the same shape as the first electrode patterns 2331, and connection patterns 2332*c* integrally interconnecting the neighboring second electrode patterns 2332.

Here, the first electrode patterns 2331, the second electrode patterns 2332 and the connection patterns 2332*c* may be formed in a first layer, e.g., the same transparent electrode layer, the metal bridges 231 may be formed in a second layer provided with a first interlayer insulating film 232 interposed between the first layer and the second layer, and the first interlayer insulating film 232 may be provided with contact holes 232*a* corresponding to overlapping regions between the metal bridges 231 and the second electrode patterns 2332.

Here, since the touch electrode array 230 is formed on the upper substrate (not shown), the surface of the upper substrate (not shown) on which the touch electrode array 230 is formed, shown in FIG. 5, is bonded to the organic light emitting device array 150 and is turned at an angle of 180°.

Although the above-described touch electrode array 230 is a capacitive touch electrode array, various other types of touch electrode arrays may be applied as the touch electrode array 230 of the organic light emitting display in accordance with an embodiment of the present invention.

Routing lines 231*b* and 231*c* are formed in a non-display area of the lower substrate 100, e.g., around an edge of the lower substrate 100 at which the first and second electrode patterns 2331 and 2332 are not formed, so as to be connected to the touch pad parts 2350 and the first and second electrode patterns 2331 and 2332. Here, the routing lines 231*b* are connected to the first and second electrode patterns 2331 and 2332 and transmit signals from the touch pads 2351*b* to the first and second electrode patterns 2331 and 2332.

Figure 6A:
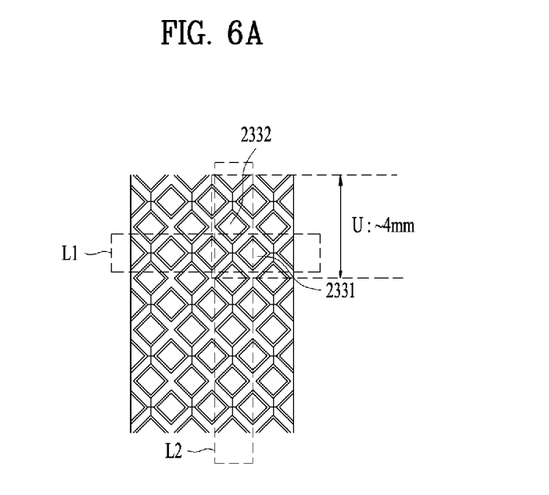
FIGS. 6A and 6B are plan views illustrating electrode patterns provided in a touch electrode array and a touch electrode array extension.
Figure 6B:
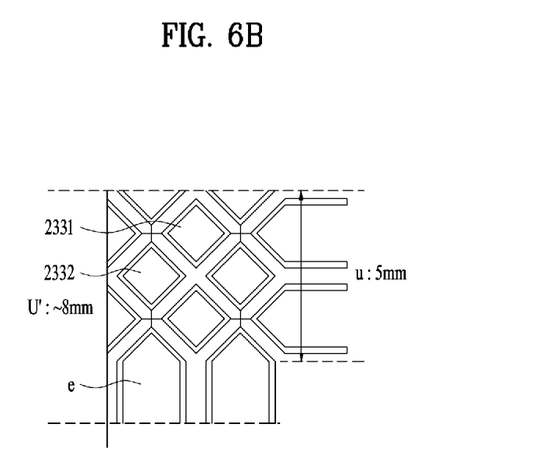

FIGS. 6A and 6B are plan views illustrating electrode patterns provided in the touch electrode array 230 and the touch electrode array extension 2300.

Prior to describing electrode patterns provided in the touch electrode array extension 2300, a unit touch electrode and a unit touch electrode pitch will now be defined.

First, a plurality of first electrode patterns 2331 connected to one touch pad electrode 2351*b* and located collinearly in the X-axis direction is defined as a first touch electrode line L1, and a plurality of second electrode patterns 2332 connected to another touch pad electrode 2351*b* and located collinearly in the Y-axis direction is defined as a second touch electrode line L2.

A plurality n (n being a natural number) of first touch electrode lines L1 or a plurality n of second touch electrode lines L2 may be connected to each of the touch pad electrodes 2351*b* through the routing lines.

The touch electrode array 230 includes a plurality of unit sensors U. The unit sensor U includes nodes formed by allowing n of the first touch electrode lines L1 connected to one touch pad electrode and n of the second touch electrode lines L2 connected to another touch pad electrode to cross each other, and is defined to have a rectangular shape, four sides of which pass by the first and second touch electrodes adjacent to the outsides of the nodes so as to bisect the first and second touch electrodes. Here, the unit sensor U is the basic unit of sensors to recognize the coordinates of a touch position.

FIG. 6A is a plan view illustrating a unit sensor U provided in the touch electrode array 230, and FIG. 6B is a plan view illustrating an extension unit sensor U' provided in the touch electrode array extension 2300.

FIGS. 6A and 6B exemplarily illustrate unit sensors if n=2. In FIG. 6A, a region shown by U indicates a unit sensor, and the unit sensor U includes 4 nodes N and is defined to have a square shape. In FIG. 6B, a region shown by U' indicates an extension unit sensor, and the extension unit sensor U' is the same as the unit sensor U in that the extension unit sensor U' includes 4 nodes N and is defined to have a square shape.

The extension unit sensor U' differs from the unit sensor U in that the extension unit sensor U' has a pitch which is M times the pitch of the unit sensor U (M being a natural number of 2 or more), and the extension unit sensor U' includes an extension sensor u having a pitch, which is 1-2 mm longer than the pitch of the unit sensor U, and a plurality of rectangular-shaped extension electrodes e extending from the extension sensor u to a boundary of the extension unit sensor U'.

With reference to FIG. 6B, the horizontal and vertical pitches of the unit touch electrodes are two times the horizontal and vertical pitches of conventional unit touch electrodes. Although FIG. 6B exemplarily illustrates that the pitch of the unit touch electrode is two times the pitch of a conventional unit touch electrode, the pitch of the unit touch electrode may be M times, for example, 3 times or 4 times, the pitch of a conventional unit touch electrode.

The horizontal and vertical pitches of the unit touch electrode in FIG. 6A are 4 mm, and the horizontal and vertical pitches of the unit touch electrode in FIG. 6B are 2 times the horizontal and vertical pitches of the unit touch electrode in FIG. 6A, i.e., 8 mm.

In the extension unit sensor U', if the pitches of the first and second electrode patterns 2331 and 2332 forming the extension sensor u are greatly increased, it may be difficult to sense touches due to an increase in parasitic capacitance of the first and second electrode patterns 2331 and 2332. Therefore, the pitch of the extension sensor u may be 1 to 2 mm longer than the pitch of the unit sensor U.

If the pitch of the extension sensor u is 1-2 mm longer than the pitch of the unit sensor U, the pitch of the extension unit sensor U' corresponds to M times the pitch of the unit sensor U and, thus, gaps are formed in regions where no extension sensors u are located. Such gaps are filled with the extension electrodes e extending from the first and second electrode patterns 2331 and 2332 forming the extension sensor u to a boundary of the extension unit sensor U'. As a result, an increase in the pitch of the extension sensor u is small, and the pitch of the extension unit sensor U' is additionally increased by the extension electrodes e and, thus, influence of parasitic capacitance is small, as compared to an increase in the pitch of the first and second electrode patterns 2331 and 2332.

As described above, in the case of the electrodes provided in the touch electrode array extension 2300, the support part 10 is exposed to the front when the foldable display is folded. Thereby, the support part 10 is located between the electrodes of the touch electrode array extension 2300 and a point touched by a user. Therefore, an interval between the user touched point and the electrodes located at the touch electrode array extension 2300 is greater than an interval between the electrodes of the touch electrode array 230 and the user touched point.

Further, the touch electrode array extension 2300 is provided so as to execute a simple operation when the foldable display is folded, and thus is less burdened with minutely recognizing touches than the touch electrode array 230.

In consideration of the above-described touch sensing characteristics of the touch electrode array extension 2300, the pitch of the extension unit sensors U' provided in the touch electrode array extension 2300 is greater than the pitch of the unit sensors U provided in the touch electrode array 230, as described above. As a result, the touch electrode array extension 2300 can have improved touch sensitivity to touch inputs from the outside, but may have lowered accuracy in recognition of touch coordinates.

That is, touch sensors including the extension unit sensors U' provided in the touch electrode array extension 2300 may effectively sense touch inputs through the support part 10 and execute a simple touch operation without any problems.

Further, the extension unit sensors U' is not tasked with recognizing minute touches and, thus, it is possible to design the extension unit sensors U' such that one extension unit sensor U' having a pitch of M times the pitch of the unit sensor U may recognize a plurality of coordinates.

Figure 7A:
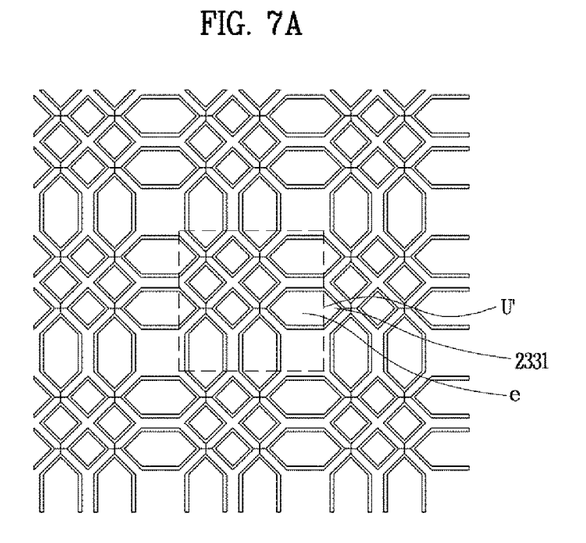
FIGS. 7A and 7B are exemplary views illustrating patterns in which extension unit sensors U' of a touch electrode array extension are formed.
Figure 7B:
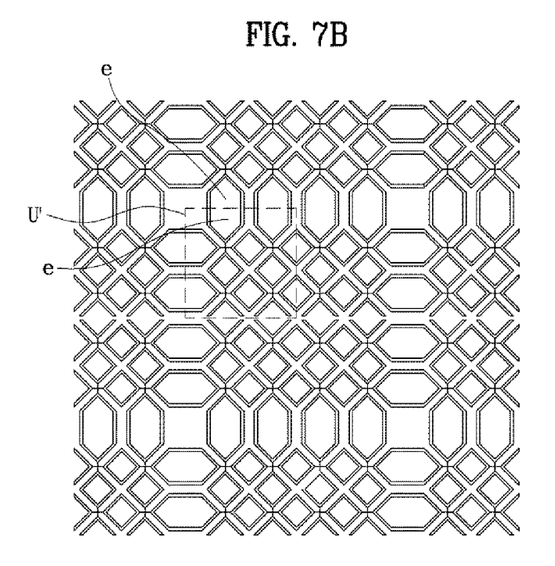

FIGS. 7A and 7B are exemplary views illustrating patterns in which extension unit sensors U' of the touch electrode array extension 2300 are formed.

The extension unit sensors U' may be continuously arranged in the same direction, as exemplarily shown in FIG. 7A. Here, the extension unit sensors U' may be arranged such that the extension electrodes e of the extension unit sensor U' contact the first electrode pattern 2331 or the second electrode pattern 2332 of other neighboring extension unit sensors U'.

Further, the extension unit sensors U' may be arranged such that neighboring extension unit sensors U' are symmetrical with each other with respect to the X-axis or Y-axis direction, as exemplarily shown in FIG. 7B. Here, the extension unit sensors U' may be arranged such that the extension electrodes e of the extension unit sensor U' contact the extension electrodes e of other neighboring extension unit sensors U' and the first electrode patterns 2331 and the second electrode patterns 2332 of the extension unit sensor U' contact the first electrode pattern 2331 and the second electrode pattern 2332 of other neighboring extension units sensors U'.

A touch signal input from the touch electrode array 230 is transmitted to the driver IC 500. The driver IC 500 converts the touch signal input from the touch electrode array 230 into digital sensing data and transmits the digital sensing data to the MCU, and the MCU generates touch coordinates using the digital sensing data and outputs the generated touch coordinates to an external set.

The MCU determines whether or not the display panel 200 is folded and, if the display panel 200 is not folded, controls the driver IC 500 so as to inactivate touch sensing of the touch electrode array extension 2300 and to activate touch sensing of the touch electrode array 230.

Further, if the display panel 200 is folded, the MCU controls the driver IC 500 so as to activate touch sensing of the touch electrode array extension 2300. Further, the MCU controls the driver IC 500 so as to inactivate touch sensing of the touch electrodes of the touch electrode array 230 except for the touch electrodes of the touch electrode array extension 2300, or senses a touch signal input from the touch electrode array 230 in a manner in which a touch signal input from the touch electrode array extension 2300 is sensed with the highest priority.

As described above, a foldable display according to an embodiment of the present invention is configured such that a touch input to a display area, which is exposed when the foldable display is folded, is enabled through touch sensors provided in a touch electrode array extension 2300. Further, the display area exposed when the foldable display is folded is protected from external environments or external impact by a support part 10.

It will be apparent to those skilled in the art that various modifications and variations can be made in the present invention without departing from the spirit or scope of the inventions. Thus, it is intended that the present invention covers the modifications and variations of this invention provided they come within the scope of the appended claims and their equivalents.

What is claimed is:
1. A foldable display comprising:
a display panel including an organic light emitting device array, a thin film transistor array configured to drive the organic light emitting device array, and a touch electrode array, in which an array of touch electrodes is provided, bonded to the organic light emitting device array through a first adhesive layer, the display panel having at least one folding area; and
a support part adhered to a rear surface of the display panel through a second adhesive layer, wherein:
the touch electrode array includes a touch electrode array extension extending further than one end of the organic light emitting device array and located facing the other end of the organic light emitting device array when the display panel is folded; and
the display panel displays an image in a display area corresponding to the touch electrode array extension when the display panel is folded.

2. The foldable display according to claim 1, wherein:
the support part extends to the rear surface of the touch electrode array extension; and
a thickness of the second adhesive layer located at an extension region of the support part is greater than a thickness of the second adhesive layer located at other regions of the support part by a total thickness of the organic light emitting device array and the thin film transistor array.

3. The foldable display according to claim 2, wherein the extension region of the support part is formed of a transparent glass or polymer.

4. The foldable display according to claim 1, further comprising an outer frame configured to fix or accommodate the display panel, the support part and a polarizing plate,
wherein the touch electrode array extension is fixed by the outer frame.

5. The foldable display according to claim 1, wherein the touch electrode array includes first touch electrodes including a plurality of first electrode patterns connected in a first direction and second touch electrodes including a plurality of second electrode patterns connected in a second direction through connection patterns, wherein:
n (n being a natural number) of the first touch electrodes connected to any one of a plurality of first touch pad electrodes;
n of second touch electrodes are commonly connected to any one of a plurality of second touch pad electrodes.

6. The foldable display according to claim 5, wherein:
a rectangular-shaped unit sensor, including nodes formed by allowing n first touch electrodes (n being a natural number of 1 or more) connected to any one of the first touch pad electrodes and n second touch electrode lines connected to any one of the second touch pad electrodes to intersect each other, four sides of the unit sensor passing by the first and second touch electrodes adjacent to the outsides of the nodes so as to bisect the first and second touch electrodes, is defined;

the pitch of an extension unit sensor located at the touch electrode array extension is M times (M being a natural number of 2 or more) the pitch of the unit sensor located at regions of the touch electrode array except for the touch electrode array extension, wherein the extension unit sensor includes:

an extension sensor having the same shape as the unit sensor and a pitch being 1-2 mm longer than the pitch of the unit sensor; and a plurality of rectangular-shaped extension electrodes extending from the extension sensor to the boundary of the extension unit sensor.

7. The foldable display according to claim 6, wherein the extension electrodes of the extension unit sensor contact the first electrode patterns or the second electrode patterns of other neighboring extension unit sensors.

8. The foldable display according to claim 6, wherein:
the extension electrodes of the extension unit sensor contact the extension electrodes of other neighboring extension unit sensors;
the first electrode patterns of the extension unit sensor contact the first electrode patterns of other neighboring extension unit sensors; and
the second electrode patterns of the extension unit sensor contact the second electrode patterns of other neighboring extension unit sensors.

9. The foldable display according to claim 1, further comprising:
a driver IC configured to drive the touch electrode array; and
a MCU configured to determine whether or not the display panel is folded and, if the display panel is folded, configured to control the driver IC so as to activate touch sensing of the touch electrode array extension and to control the driver IC so as to inactivate touch sensing of a region corresponding to a display area exposed when the display panel is folded or to senses a touch signal input from the touch electrode array extension with higher priority than a touch signal input from the touch electrode array in the region corresponding to the display area exposed when the display panel is folded and, if the display panel is not folded, configured to control the driver IC so as to inactivate touch sensing of the touch electrode array extension.

* * * * *